United States Patent
Giovannone et al.

(10) Patent No.: US 11,791,720 B2
(45) Date of Patent: Oct. 17, 2023

(54) METHODS AND APPARATUS FOR A DIRECT CURRENT-DIRECT CURRENT CONVERTER COMPATIBLE WITH WIDE RANGE SYSTEM CLOCK FREQUENCY

(71) Applicant: STMicroelectronics S.r.l., Agrate Brianza (IT)

(72) Inventors: Juri Giovannone, Cernobbio (IT); Valeria Bottarel, Novara (IT); Stefano Corona, Borgarello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 175 days.

(21) Appl. No.: 17/364,147

(22) Filed: Jun. 30, 2021

(65) Prior Publication Data
US 2023/0006546 A1    Jan. 5, 2023

(51) Int. Cl.
*H02M 3/04*      (2006.01)
*H03K 5/24*      (2006.01)
(Continued)

(52) U.S. Cl.
CPC ............... *H02M 3/04* (2013.01); *H03K 5/24* (2013.01); *G06F 1/26* (2013.01); *H03K 2005/00058* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24;
(Continued)

(56) References Cited

U.S. PATENT DOCUMENTS 6,087,868 A *   7/2000   Millar .................. G11C 7/22
                                               327/158
6,642,760 B1 *   11/2003   Alon .................. H03K 3/037
                                               327/158

(Continued)

OTHER PUBLICATIONS

Batarseh, Majd, "Digital Pulse Width Modulator Techniques for DC-DC Converters," Electronic Theses and Dissertations, STARS, May 2010, 170 pages.

*Primary Examiner* — Thienvu V Tran
*Assistant Examiner* — Nusrat Quddus
(74) *Attorney, Agent, or Firm* — Slater Matsil, LLP

(57) ABSTRACT

A direct current (DC) to DC (DC-DC) converter includes a comparator setting a pulse width of a signal pulse, the pulse width corresponding to a voltage level of an output voltage of the DC-DC converter; a digital delay line (DDL) operatively coupled to the comparator, the DDL adjusting the pulse width of the signal pulse by linearly introducing delays to the signal pulse; a multiplexer operatively coupled to the DDL, the multiplexer selectively outputting a delayed version of the signal pulse; a phase detector operatively coupled to a system clock and the multiplexer, the phase detector generating a phase error between an output of the multiplexer and the system clock; and a logic control circuit operatively coupled to the multiplexer and the DDL, the logic control circuit adjusting the delay introduced to the signal pulse in accordance with the phase error.

20 Claims, 9 Drawing Sheets

(51) Int. Cl.
*G06F 1/26* (2006.01)
*H03K 5/00* (2006.01)

(58) Field of Classification Search
CPC .......... G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 3/07; H02M 3/073; H02M 2003/071; H02M 2003/072; H02M 2003/075; H02M 2003/076; H02M 2003/077; H02M 2003/078; H02M 2001/0048; H02M 1/12; H02M 3/3155; H02M 3/33507; H02M 3/33546; H02M 7/1557; H02M 7/1626; H02M 1/4208; H02M 7/219; H02M 7/151; H02M 1/4233; H02M 5/4585; H02M 1/08; H02M 7/1552; H02M 7/1623; H02M 1/4225; H02M 3/33592; H02M 3/137; H02M 7/00; H02M 7/064; H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4216; H02M 1/4241; H02M 1/425; H02M 1/4258; H02M 1/4266; H02M 2001/4275; H02M 2001/4283; H02M 2001/4291; H05B 39/048; B23K 11/24; H04B 2215/069; H02J 3/46; H02J 3/38

See application file for complete search history.

(56) References Cited

U.S. PATENT DOCUMENTS

| | | | |
|---|---|---|---|
| 7,202,651 B2 | 4/2007 | Chapuis | |
| 7,236,028 B1* | 6/2007 | Choi | H03L 7/0814 327/158 |
| 7,656,136 B2* | 2/2010 | Chang | H02M 3/1582 323/283 |
| 7,710,209 B2 | 5/2010 | Prodic et al. | |
| 8,330,548 B2* | 12/2012 | Wagner | H03K 3/0315 327/156 |
| 8,917,128 B1* | 12/2014 | Baek | G11C 7/222 327/158 |
| 9,941,889 B1* | 4/2018 | Guo | H03K 21/00 |
| 10,381,915 B1 | 8/2019 | Dusmez | |
| 10,474,110 B1* | 11/2019 | Horovitz | H03L 7/085 |
| 11,095,218 B2* | 8/2021 | Kim | H02M 3/158 |
| 2003/0214332 A1* | 11/2003 | Chen | H03L 7/0891 327/156 |
| 2005/0200342 A1* | 9/2005 | Rudiak | H02M 3/1588 323/282 |
| 2007/0024331 A1* | 2/2007 | Lin | G11C 7/20 327/141 |
| 2007/0126410 A1* | 6/2007 | Figoli | H02M 1/38 323/283 |
| 2008/0054958 A1* | 3/2008 | Liu | H03L 7/0816 327/149 |
| 2009/0206884 A1* | 8/2009 | Shin | H03L 7/087 327/158 |
| 2016/0204774 A1* | 7/2016 | Liu | H03K 21/023 327/160 |
| 2018/0191356 A1* | 7/2018 | Kesarwani | H03L 7/0995 |

* cited by examiner

METHODS AND APPARATUS FOR A DIRECT CURRENT-DIRECT CURRENT CONVERTER COMPATIBLE WITH WIDE RANGE SYSTEM CLOCK FREQUENCY

CROSS REFERENCE TO RELATED APPLICATION

This application is further related to application Ser. No. 17/364,063, filed concurrently with this application on Jun. 30, 2021, which is incorporated by reference in entirety.

TECHNICAL FIELD

The present invention relates generally to methods and apparatus for a direct current (DC) to DC (DC-DC) converter compatible with wide range system clock frequency.

BACKGROUND

A direct current (DC) to DC (DC-DC) converter converts a DC input voltage to a DC output voltage. Depending on the operation, the DC-DC converter may produce a relatively constant DC output voltage for any range of DC input voltages.

A digitally controlled DC-DC converter offers a large performance envelope, which may encompass acceptable DC input voltage range, producible DC output voltage range, and stability of the DC output voltage. Therefore, digitally controlled DC-DC converters are good candidates for deployments where flexibility is desired.

SUMMARY

An advantage of the example embodiments is that the frequency range of a digitally controlled DC-DC converter is controlled. The ability to control the frequency range of the digitally controlled DC-DC converter allows for the enlargement of the operating range of the digitally controlled DC-DC converter. In other words, the digitally controlled DC-DC converter can be utilized over a wider range of system clock values.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

In the ensuing description one or more specific details are illustrated, aimed at providing an understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

A direct current (DC) to DC (DC-DC) converter is used to convert a DC input voltage to a DC output voltage. DC-DC converters may be used in a wide variety of applications, including portable electronic devices (such as cellular telephones, laptop computers, etc.) or automotive applications, for example, where a DC input voltage (from a battery, for example) is converted to a DC output voltage to power circuits. In some applications, multiple DC output voltages are needed for different circuits of a single device. Additionally, some applications have multiple DC input voltages, so the DC-DC converter may need to support operation with different DC input voltages.

Traditional DC-DC converters use analog control circuitry due to the control circuitry's simple implementation and efficiency. However, advancements in digital technology have led to digitally controlled DC-DC converters that offer high-speed operation with low power consumption.

Figure 1:
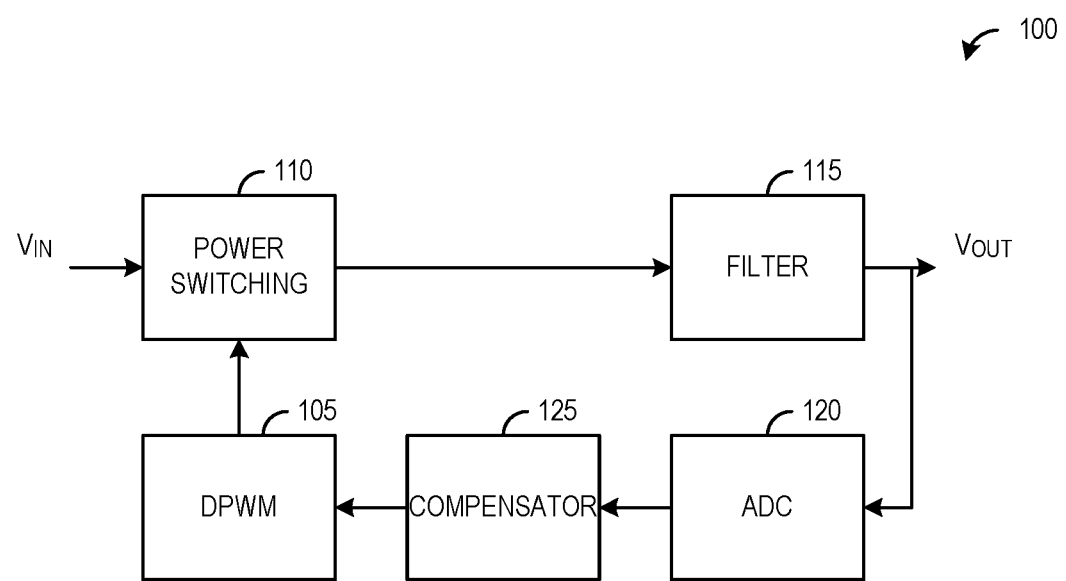
FIG. 1 illustrates a high-level view of a prior art digitally controlled direct current (DC) to DC (DC-DC) converter.

FIG. 1 illustrates a high-level view of a prior art digitally controlled DC-DC converter 100. DC-DC converter 100 includes a digital pulse width modulator (DPWM) 105 that generates a stream of variable width pulses that drives a power stage of DC-DC converter 100 in order to obtain the desired DC output voltage. DPWM 105 changes the pulse widths of the pulses in the stream of variable width pulses to achieve the desired DC output voltage. The stream of variable width pulses is amplified by a power switching circuit 110, while a filter 115 averages the amplified stream of variable width pulses to produce the DC output voltage $V_{OUT}$.

An analog to digital converter (ADC) 120 converts a difference (an error) between the DC output voltage $V_{OUT}$ and the desired DC output voltage, and a compensator 125 generates adjustments (e.g., adjustments to the pulse widths) to the stream of variable width pulses to reduce the difference between the DC output voltage $V_{OUT}$ and the desired DC output voltage. Adjustments to the stream of variable width pulses may include changing pulse widths, the duration of the on and off periods of each pulse in the stream of variable width pulses, and so on. As an example, increasing the pulse width of a pulse will increase the DC output voltage $V_{OUT}$, while decreasing the on period of a pulse will decrease the DC output voltage $V_{OUT}$.

Figure 2A:
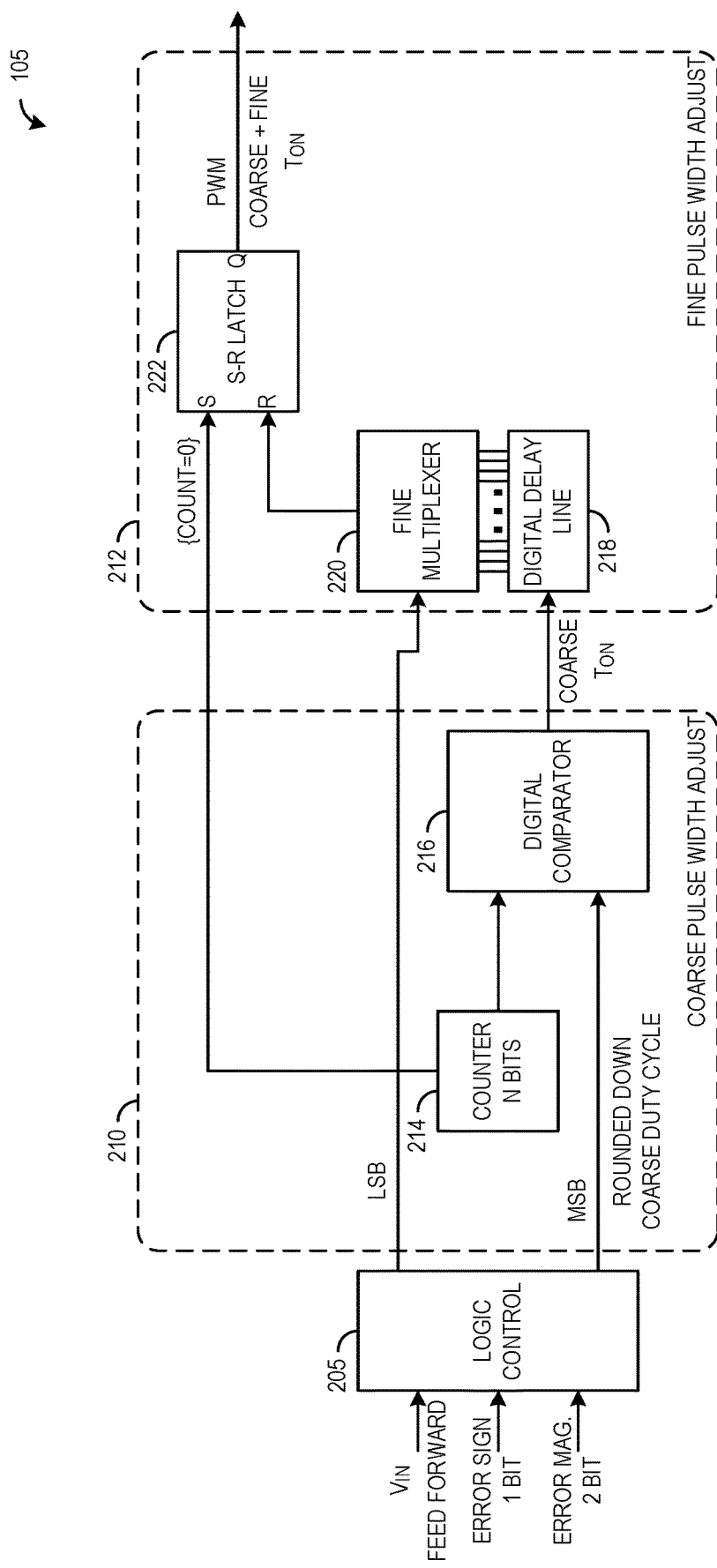
FIG. 2A illustrates a detailed view of a prior art hybrid digital pulse width modulator (DPWM)

FIG. 2A illustrates a detailed view of a prior art DPWM 105. DPWM 105 utilizes a hybrid technique for generating the stream of variable width pulses. DPWM 105 generates a stream of pulses with pulse widths that can adjusted. The discussion presented herein focuses on a single pulse to help prevent confusion. This single pulse will be referred to as a first pulse having a first pulse width. DPWM 105 generates a first pulse width that is generally close to the desired pulse width and then fine tunes the pulse width to more accurately match the desired pulse width. As shown in FIG. 2A, DPWM 105 includes a logic control circuit 205, a coarse pulse width adjust circuit 210, and a fine pulse width adjust circuit 212. Logic control circuit 205 is configured to output a binary value based on the DC input voltage $V_{IN}$, the binary value is also based on an error sign and an error magnitude (both produced by compensator 125, for example). The binary value produced by logic control circuit 205 corresponds to a pulse width of individual pulses of the stream of variable width pulses, which may be based on the DC input voltage $V_{IN}$, as well as error values generated by compensator 125.

Coarse pulse width adjust circuit 210 generates the first pulse width of the pulse, and includes a counter 214 and a digital comparator 216. Counter 214 is configured to increment (or decrement) based on a clock signal of DC-DC converter 100, and comparator 216 compares an output of counter 214 with a specified bit (or bits) of the binary value produced by logic control circuit 205, with the specified bit corresponding to a falling edge of an individual pulse of the stream of variable width pulses. In general, the time between when counter 214 commences counting and the falling edge corresponds to the first pulse width of the pulse. As an example, the specified bit is a most significant bit (MSB) of the binary value produced by logic control circuit 205. Coarse pulse width adjust circuit 210 may operates as follows:

Rising edge of an individual pulse occurs when counter 214 commences, e.g., when counter 214 is reset (to zero, for example). Alternatively, rising edge of an individual pulse may occur based on an output of fine pulse width adjust circuit 212 (e.g., a falling edge of a previous pulse);

Falling edge of an individual pulse occurs when the specified bit (e.g., the MSB) of the output of counter 214 is equal to the specified bit of the output of the binary value produced by logic control circuit 205; and Coarse pulse width adjust circuit 210 operates continually to produce the stream of variable width pulses.

Fine pulse width adjust circuit 212 performs fine tuning on the pulses of the stream of pulses, however, the discussion presented herein focuses on a single pulse of the stream of pulses to help prevent confusion. Fine pulse width adjust circuit 212 performs fine tuning on the first pulse width, and includes a digital delay line (DDL) 218, a fine multiplexer 220, and a register 222. DDL 218 introduces delays to the rising and falling edge of the individual pulses produced by coarse pulse width adjust circuit 210, allowing fine adjustments to the pulse width of the individual pulses. Fine pulse width adjust circuit 212 can introduce the same delay or different delays to the rising and falling edges of a single pulse. DDL 218 is implemented as a linear sequence of buffers, with each buffer introducing a delay proportional to the propagation delay of the buffer. Fine multiplexer 220 has multiple inputs with each input coupled to a buffer output of DDL 218. Fine multiplexer 220 selects a particular delayed rising or falling edge of the individual pulse based on the binary value produced by logic control circuit 205. The selection of fine multiplexer 220 is based on a least significant bit (LSB) of the binary value generated by logic control circuit 205. Register 222, which is implemented using S-R latches, for example, is set (outputting a high value) when counter 214 is reset and is reset (outputting a low value) when fine multiplexer 220 outputs a high value (which corresponds to a time that is a sum of the time of the falling edge produced by coarse pulse width adjust circuit 210 and the time delay introduced by DDL 218) resetting register 222. Hence, the pulse width of the individual pulse is a sum of the pulse width of the pulse generated by coarse pulse width adjust circuit 210 (COARSE $T_{ON}$) and delay imparted upon the individual pulse by fine pulse width adjust circuit 212 (FINE $T_{ON}$).

Figure 2B:
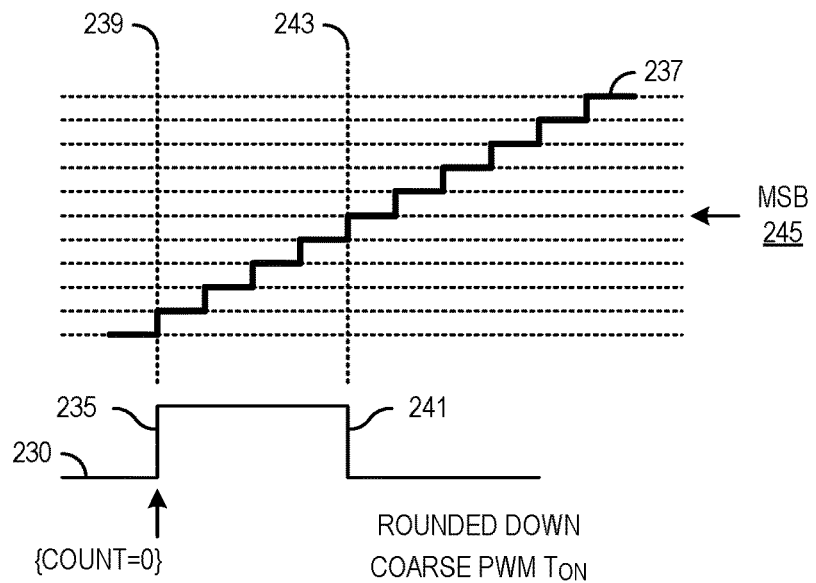
FIG. 2B illustrates a detailed view of a pulse output by coarse pulse width adjust circuit.

FIG. 2B illustrates a detailed view of a pulse 230 output by coarse pulse width adjust circuit 210. Pulse 230 is an individual pulse of the stream of variable pulse pulses. Pulse 230 has a rising edge 235 that corresponds to when counter 214 is reset (trace 237 represents the value of counter 214), which is shown in FIG. 2B as occurring at time 239. Pulse 230 also has a falling edge 241 located at time 243, when the specified bit of counter 214 is equal to the specified bit of the binary value produced by logic control circuit 205. Pulse 230 has a pulse width equal to COARSE $T_{ON}$.

Figure 2C:
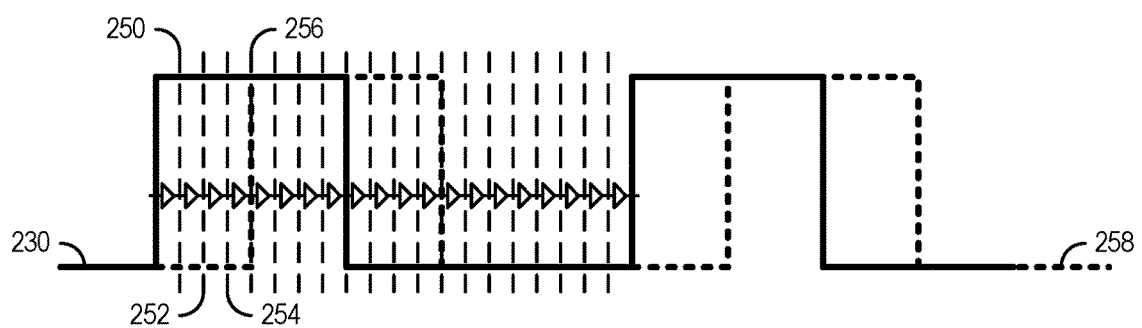
FIG. 2C illustrates a detailed view of pulse delayed by a digital delay line (DDL) 218 of fine pulse width adjust circuit.

FIG. 2C illustrates a detailed view of pulse 230 delayed by DDL 218 of fine pulse width adjust circuit 212. Pulse 230 (output of comparator 216 of coarse pulse width adjust circuit 210) is provided to DDL 218. As discussed previously, DDL 218 comprises a linear sequence of delay elements (e.g., buffers), with each delay element introducing a delay proportional to the propagation delay of the delay element. As shown in FIG. 2C, a time 250 corresponds to a delay introduced by a first delay element of DDL 218, a time 252 corresponds to a delay introduced by a second delay element of DDL 218, a time 254 corresponds to a delay introduced by a third delay element of DDL 218, a time 256 corresponds to a delay introduced by a fourth delay element of DDL 218, and so on. Pulse 258 illustrates pulse 230 delayed by the first four delay elements of DDL 218. The delay introduced by the delay elements is equal to $N*T_{CLK}$=FINE $T_{ON}$, where N is the number of delay elements and $T_{CLK}$ is the switching period of the clock of DC-DC converter 100. Hence, it is possible to increase the pulse width of pulse 230 by utilizing the rising edge of pulse 230 and a falling edge of a delayed pulse (e.g., pulse 258) to produce a pulse with pulse width approximately equal to COARSE $T_{ON}$+N*$T_{CLK}$.

An issue that exists with the prior art DC-DC converter 100 is the power consumption associated with the circuitry providing the fine pulse width control, e.g., fine pulse width adjust circuit 212. Individually, each delay element in the linear sequence of delay elements has relatively small power consumption. However, in situations where there may be several hundred delay elements (or more) in the linear sequence of delay elements, the total power consumption may be high. Furthermore, the linear sequence of delay elements is continually consuming power, even in situations where there is no need to adjust the pulse width.

For discussion purposes, consider a situation where the prior art DC-DC converter 100 is a buck converter with the following parameters, which are determined from the requirements for the DC-DC converter:

$f_{SW}$=switching frequency;
$V_{IN}$=input voltage;
$V_{OUT}$=output voltage; and
$\Delta V_{OUT}$=maximum change in the output voltage.

While $f_{CLK}$ (the system clock frequency) directly depends on $n = V_{IN}/\Delta V_{OUT}$.

With consideration being given to the fact that $V_{IN}$ may cover a wide range of values, there is a tradeoff between the precision of DC-DC converter 100 and the power consumption of DC-DC converter 100, where the precision of DC-DC converter 100 is a measure of how well the output voltage of DC-DC converter 100 matches up to the expected output voltage of DC-DC converter 100. In general, the worst operating conditions occur when the input voltage is about equal to the maximum input voltage, where a large $V_{IN}$ implies a large n and a large $f_{CLK}$, which leads to high power consumption (which is needed to guarantee the required precision for every input-output condition). Therefore, ensuring that the input-output conditions are met for large $V_{IN}$ leads to DC-DC converter 100 consuming more power than necessary for all other possible smaller values of $V_{IN}$.

Additionally, the tradeoff between the precision of the DC-DC converter and the power consumption of the DC-DC converter is different for different duty cycle ($\delta=V_{OUT}/V_{IN}$). If $V_{IN}$ covers a wide range of possible values, the tradeoff between precision and power consumption should be defined in the worst case (e.g., for high $V_{IN}$, which corresponds to higher power consumption in order to achieve the required precision). Consequently, the DC-DC converter is consuming more energy (when compared to other possible (but lower) values of $V_{IN}$).

Figure 3:
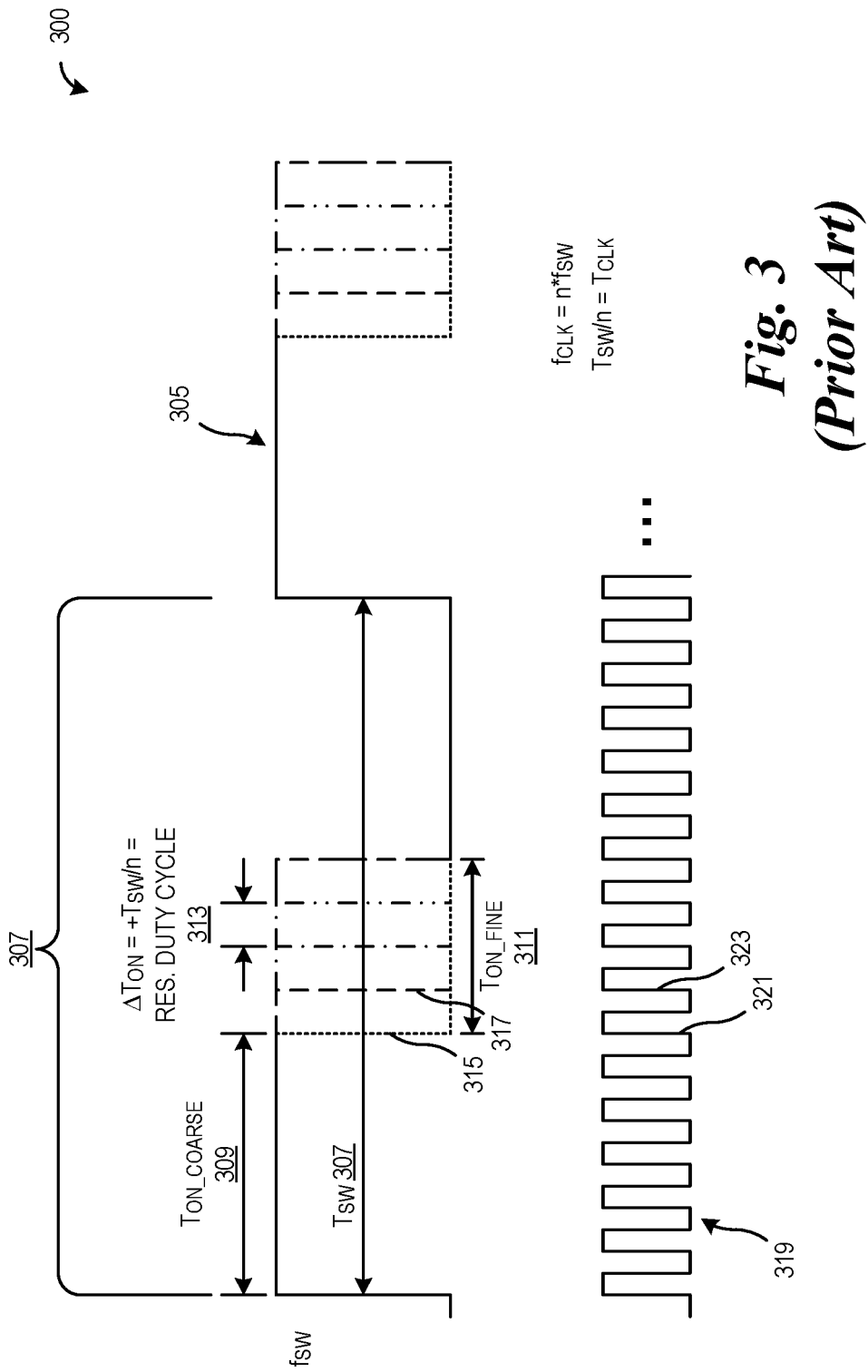
FIG. 3 illustrates a diagram displaying the coarse and fine contributions to $T_{ON}$ of a PWM signal by the prior art hybrid DPWM of FIG. 2A.

FIG. 3 illustrates a diagram 300 displaying the coarse and fine contributions to $T_{ON}$ of a PWM signal by DPWM 105. Diagram 300 displays a signal 305 representing the output of register 222 of DPWM 105 of prior art DC-DC converter 100, which is a stream of pulses with pulse widths that is a sum of the output of comparator 216 and fine multiplexer 220. Signal 305 comprises a plurality of pulses, such as pulse 307. Pulse 307 has a duration $T_{SW}$ (or a frequency of $f_{SW}$), and a pulse width equal to the sum of $T_{ON\_COARSE}$ 309 and $T_{ON\_FINE}$ 311, where $T_{ON\_COARSE}$ 309 is the pulse width generated by comparator 216 and $T_{ON\_FINE}$ 311 is the pulse width generated by fine multiplexer 220. $T_{SW}$ is the switching time of DC-DC converter 100, while $f_{SW}$ is the switching frequency of DC-DC converter 100.

As shown in FIG. 3, each delay element of DDL 218 adds a delay equal to $\Delta T_{ON}$ 313 to $T_{ON\_FINE}$ 311. As an example, if DDL 218 is configured to add zero delay to pulse 307, then pulse 307 ends at edge 315, while if DDL 218 is configured to add one delay to pulse 307, then pulse 307 ends at edge 317 (which is $T_{ON\_COARSE}$ 309+1*$\Delta T_{ON}$ 313, and so on. Signal 319 represents the clock of prior art DC-DC converter 100, with $f_{CLK}$=n*$f_{SW}$, and $T_{SW}$/n=$T_{CLK}$.

$\Delta T_{ON}$ may be expressed as a function of $T_{CLK}$ as $\Delta T_{ON}=T_{CLK}=T_{SW}/n$ $\Delta T_{ON}=T_{CLK}=\Delta\delta*T_{SW}$ From which, $\Delta\delta*T_{SW}=T_{SW}/n$ and $\Delta\delta=1/n$ $\delta=V_{OUT}/V_{IN}$ hence, $\Delta\delta=(\Delta V_{OUT})/V_{IN}$ $1/n=\Delta\delta=(\Delta V_{OUT})/V_{IN}$ $\Delta V_{OUT}=V_{IN}/n$ Therefore, $n=V_{IN}/\Delta V_{OUT}$.

As an illustrative example, consider a deployment of prior art DC-DC converter 100 with a wide range of $V_{IN}$, and $V_{OUT}$=4 volts, and $V_{OUT}$ precision=0.5%. If a high $V_{IN}$ is considered, e.g., $V_{IN}$=40 volts, then $\delta\pm\Delta\delta$ $=(V_{OUT}\pm\Delta V_{OUT})/V_{IN}$ $=(4\pm0.5\%*4)/40$ $=N*T_{CLK}/T_{SW}\pm T_{CLK}/T_{SW}$ $=N*(1/n)\pm1/n$ $=(4\pm0.5\%*4)/40=(4\pm0.2)/40=1/10\pm0.5/100$ $\Delta\delta=+0.5\%*4/40=\pm0.2/40=+0.5/100=T_{CLK}/T_{SW}$ $f_{CLK}=200*f_{SW}==>n=200$.

However, if $V_{IN}$=8 volts, then $\delta\pm\Delta\delta$ $=(V_{OUT}\pm\Delta V_{OUT})/V_{IN}$ $=(4+0.5\%*4)/8$ $=N*T_{CLK}/T_{SW}\pm T_{CLK}/T_{SW}$ $=N*(1/n)\pm1/n$ $=(4\pm0.5\%*4)/8=(4\pm0.2)/8=1/2\pm2.5/100$ $\Delta\delta=+0.5\%*4/8=\pm0.2/8=+2.5/100=T_{CLK}/T_{SW}$ $f_{CLK}=40*f_{SW}==>n=40$.

Comparing the two values of n for different input voltages, if the input voltage is large, n is large, while n is smaller for smaller input voltages. The analysis presented above is for buck converters. However, the concept is also applicable to boost converters, as well as other converter topologies.

Figure 4A:
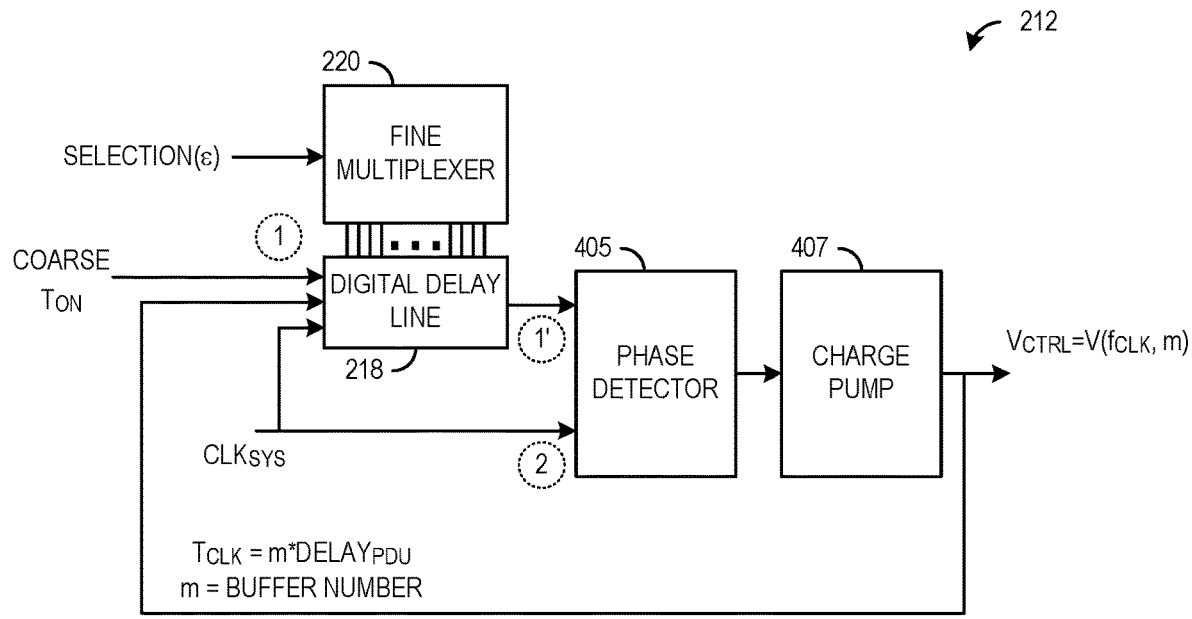
FIG. 4A illustrates a detailed view of a digital delay line (DDL) of a fine pulse width adjust circuit of prior art hybrid DPWM of FIG. 2A.

FIG. 4A illustrates a detailed view of DDL 218 of fine pulse width adjust circuit 212 of prior art DC-DC converter 100. As discussed previously, fine multiplexer 220 selects a fine tuned delay introduced to a pulse generated by coarse pulse width adjust circuit 210 by a delay element of DDL 218 in accordance with a selection signal. Fine multiplexer 220 may select a delay as small as zero to as large as the number of delay elements in DDL 218. The output of DDL 218 is provided to a phase detector 405 and a charge pump 407. Phase detector 405 generates an error signal that is proportional to a phase error between the system clock of the DC-DC converter and the output of DDL 218. Charge pump 407 utilizes the error signal from phase detector 405 to change $V_{CTRL}$, which is provided to DDL 218 to adjust the delay value of each delay element ($T_{CLK}$=m*$DELAY_{PDU}$). Digital circuits of DDL 218 may be clocked by a system clock $CLK_{SYS}$ having a system clock frequency $f_{CLK}$.

Fine pulse width adjust circuit 212 may operate in an open loop configuration with initial calibration as a voltage controlled delay line, where the initial calibration fixes the $V_{CTRL}$ and may be stored in a memory, for example. Fine pulse width adjust circuit 212 may alternatively operate in a closed loop configuration where the $V_{CTRL}$ is continuously adjusted.

Figure 4B:
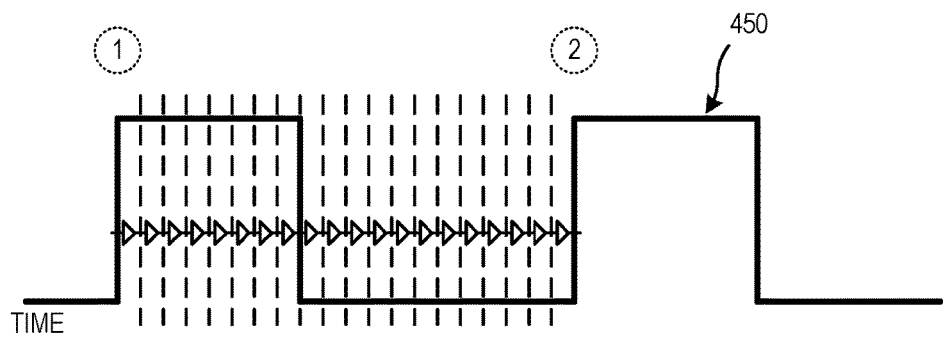
FIG. 4B illustrates a signal displaying a comparison of an input pulse and a delayed version of the input pulse.

FIG. 4B illustrates a signal 450 displaying a comparison of an input pulse and a delayed version of the input pulse. Signal 450 is representative of a signal at input of DDL 218 (at node 1, for example), while dashed vertical lines are representative of delayed versions of the signal, as introduced by the delay elements of DDL 218.

The frequency of the signal $f_{SW}$ and the maximum clock frequency $f_{CLK}$ may also impact the choice of the delay element number m. The determination of m is as follows:

$$\Delta T_{ON}=T_{CLK}/m=T_{SW}/(n*m)$$

$$\Delta T_{ON}=T_{CLK}/m=\Delta\delta*T_{SW}$$

$$\Delta\delta*T_{SW}=T_{SW}/(n*m)$$

$$\Delta\delta=1/(n*m)$$

$$S=V_{OUT}/V_{IN}$$

$$\Delta\delta=(\Delta V_{OUT})/V_{IN}$$

$$1/(n*m)=\Delta\delta=(\Delta V_{OUT})/V_{IN}$$

$$\Delta V_{OUT}=V_{IN}/(n*m)$$

$$(n*m)=V_{IN}/\Delta V_{OUT}$$

$$n=T_{SW}/T_{CLK}.$$

As shown above, the maximum switching frequency, as well as the minimum switching frequency of the DC-DC converter is a function of the system clock frequency $T_{CLK}$ of the DC-DC converter. As an example, the shortest possible duration for $T_{ON}$ is equal to COARSE $T_{ON}$, where COARSE $T_{ON}$ is equal to a single $T_{CLK}$ period. While the longest possible duration for $T_{ON}$ is equal to COARSE $T_{ON}$+K*$T_{CLK}$, where K is the number of delay elements in DDL 218. Then, the switching frequency of DC-DC converter is proportional to the inverse of $T_{ON}$ (because the switching frequency of the DC-DC converter is equal to the inverse of $T_{ON}$+$T_{OFF}$. Hence, the switching frequency range of the DC-DC converter ranges from a low that is proportional to 1/(COARSE $T_{ON}$+K*$T_{CLK}$) to a high that is proportional to 1/$T_{CLK}$.

Even if the delay of the delay elements of DDL 218 are capable of being changed (based on the control signal $V_{CTRL}$ driven by charge pump 407, for example), the number of delay elements is fixed by the design of DDL 218. This means that the range of system clock frequency values of the clock signal is fixed by design. Hence, $$T_{CLK\_MIN}=n*T_{DE\_MIN}=>f_{CLK\_MAX}=1/(n*T_{DE\_MIN}),$$
and $$T_{CLK\_MAX}=n*T_{DE\_MAX}=>f_{CLK\_MIN}=1/(n*T_{DE\_MAX}),$$

where $T_{CLK\_MIN}$ is the minimum period of the system clock signal, $T_{CLK\_MAX}$ is the maximum period of the system clock signal, $f_{CLK\_MAX}$ is the maximum frequency of the system clock signal, and $f_{CLK\_MIN}$ is the minimum frequency of the system clock signal.

If the system clock frequency of the DC-DC converter is fixed, then the precision of the output voltage of the DC-DC converter is limited due to the limitation in the range of the adjustment of the delay of the individual delay elements of the DDL. As an example, consider a situation where it may be desirous to reduce power consumption (e.g., the battery voltage of the battery powered device is approaching a low voltage limit, or there is a desire to maximum available battery life), then the system clock frequency may be reduced to reduce overall power consumption. However, the output of the DC-DC converter may need to remain constant. If the system clock frequency is reduced beyond the point where the DC-DC converter is able to maintain the constant output, the DC-DC converter will be unable to keep meeting the precision requirements of the output signal. Therefore, there is a need for methods and apparatus for a DC-DC converter compatible with wide range system clock frequency.

According to an example embodiment, methods and apparatus for a DC-DC converter compatible with wide range system clock frequency are provided. In an embodiment, a DC-DC converter with wide range control of the delay of the DDL of the DC-DC converter is provided. In an embodiment, circuits that tune the DDL in accordance with the system clock are provided. Given a system clock frequency for the DC-DC converter, the circuits tune the delay the DDL so that the output of the DC-DC converter remains able to meet a desired value, for example. The delay of the DDL of the DC-DC converter may be adjusted in a multi-phase process.

As an example, a first phase of the multi-phase process includes setting the system clock frequency to a desired value, for example, to reduce power consumption and then adjusting the delay of the individual delay elements of the DDL by controlling the $V_{CTRL}$ to adjust the precision of the output of the DC-DC converter to meet the desired output precision requirements (i.e., the output is within a specified threshold of the desired output). The first phase may be considered to be a fine adjustment phase. Then, if the first phase is unable to adjust the DDL to the degree needed to have the DC-DC converter produce the output that meets the desired output precision requirements, a second phase that includes changing the number of enabled delay elements in the DDL to adjust the delay of the DDL is performed. Changing the number of enabled delay elements in the DDL results in more dramatic changes in the delay of the DDL. The second phase may be considered to be a coarse adjustment phase. After performing the second phase, the first phase may be repeated to further fine tune the delay of the DDL (with the newly adjusted number of delay elements) in accordance with $V_{CTRL}$. It may be necessary to perform several iterations of the first phase and the second phase before the DC-DC converter is able to produce an output that is in accordance with the output precision requirements.

In an embodiment, the second phase is performed prior to the first phase. In this embodiment, the number of enabled delay elements of the DDL is changed until the output of the DC-DC converter is close to the desired output, although in some situations, it may be possible to have the output of the DC-DC converter meeting the desired output by changing the number of enabled delay elements. The closeness may be determined by comparing a difference between the output and the desired output with another threshold, where this threshold may be less stringent than the previous threshold. Once the output of the DC-DC converter is sufficiently close to the desired output, the first phase is performed. In the first phase, the delay of the individual enabled delay elements is changed by changing $V_{CTRL}$ until the phase error meets the phase error threshold and the $T_{ON}$ reaches the value fixed by the control loop, for example. It may be necessary to perform several iterations of the second phase and the first phase before the above occurs.

In an embodiment, during the development, manufacture, or testing of the DC-DC converter, the number of enabled delay elements of the DDL is determined for a variety of different system clock frequencies and stored in a memory. This information may then be retrieved, based on the system clock frequency of the DC-DC converter, on an as needed basis to serve as a starting point in the tuning of the delay of the DDL. Then, the first phase is performed if needed. In general, the retrieval of the information from memory instead of performing the first phase may result in a reduction of the time associated with tuning the delay of the DDL. If the first phase is also unable to adjust the delay of the DDL so the DC-DC converter produces an output that does not have the required precision, the second phase is performed, followed by the first phase. It may be necessary to perform several iterations of the second phase and the first phase before the DC-DC converter is able to produce an output that is sufficiently close to the desired output. In general, a maximum number of iterations may be equal to the delay elements of the DDL, as an example, the DDL has 128 delay elements, then the maximum number of iteration is 128, and in each iteration, a single delay element of the DDL is disabled. As an illustrative example, if the DC-DC converter is designed to operate with a system clock frequency range of 10 MHz to 100 MHz, the memory may store the number of enabled delay elements for system clock frequencies of 10 MHz, 30 MHz, 50 MHz, 70 MHz, and 90 MHz. Other system clock frequency points, as well as different numbers of points, may be used.

However, simply adjusting the delay of the DDL may be insufficient to achieve good performance for the DC-DC converter. A metric may be used to determine if adequate performance has been achieved. As an example, a phase error may be present between the system clock of the DC-DC converter and the selected output of phase multiplexer 515. Excessive phase error may lead to poor performance, as well as lead to non-linear behavior to the control loop. Hence, the phase error between the system clock and the selected output of phase multiplexer 515 is used to measure the performance of the DC-DC converter, by determining if the number of enabled delay elements in the DDL is correct, for example.

In an embodiment, the delay of the DDL may be adjusted in the first phase by adjusting the delay of the individual delay elements of the DDL. The delay of the individual delay elements of the DDL may be adjusted by changing the voltage (e.g., $V_{CTRL}$) provided to the individual delay elements of the DDL. As an example, increasing the voltage provided to the delay elements of the DDL increases the current, resulting in a decrease in the delay associated with each of the delay elements of the DDL. Therefore, the overall delay introduced by the DDL is decreased. As another example, decreasing the voltage provided to the delay elements of the DDL decreases the current, resulting in an increase in the delay associated with each of the delay elements of the DDL. Therefore, the overall delay introduced by the DDL is increased.

In an embodiment, the delay of the DDL may be adjusted in the second phase by enabling or disabling the various delay elements of the DDL. As an example, enabling one or more delay elements (in addition to the delay elements currently enabled) increases the delay of the DDL. Conversely, disabling one or more delay elements (from those delay elements that are enabled) decreases the delay of the DDL. In an embodiment, each individual delay element of the DDL may be disabled or enabled. In another embodiment, groups of delay elements of the DDL may be collectively disabled or enabled. As an example, groups of 2, 4, 8, 16, etc., delay elements of the DDL may be collectively disabled or enabled. In an embodiment, the groups of delay elements of the DDL are equal in number of delay elements. In an embodiment, the groups of delay elements of the DDL differ in the number of delay elements. Other possibilities or combinations of delay elements and delay element groups for disabling or enabling are possible.

In an embodiment, the disabled delay elements of the DDL are deactivated to reduce the power consumption of the DC-DC converter. The deactivated delay elements (by eliminating the clock or power provided to the delay elements, for example) no longer consume power, thereby reducing the overall power consumption of the DC-DC converter. In an embodiment, the disabled delay elements are deactivated only after the delay of the DDL has been adjusted so that the phase error meets the phase error threshold. In other words, the disabled delay elements are not deactivated until the adjusting of the delay of the DDL is complete.

Figure 5:
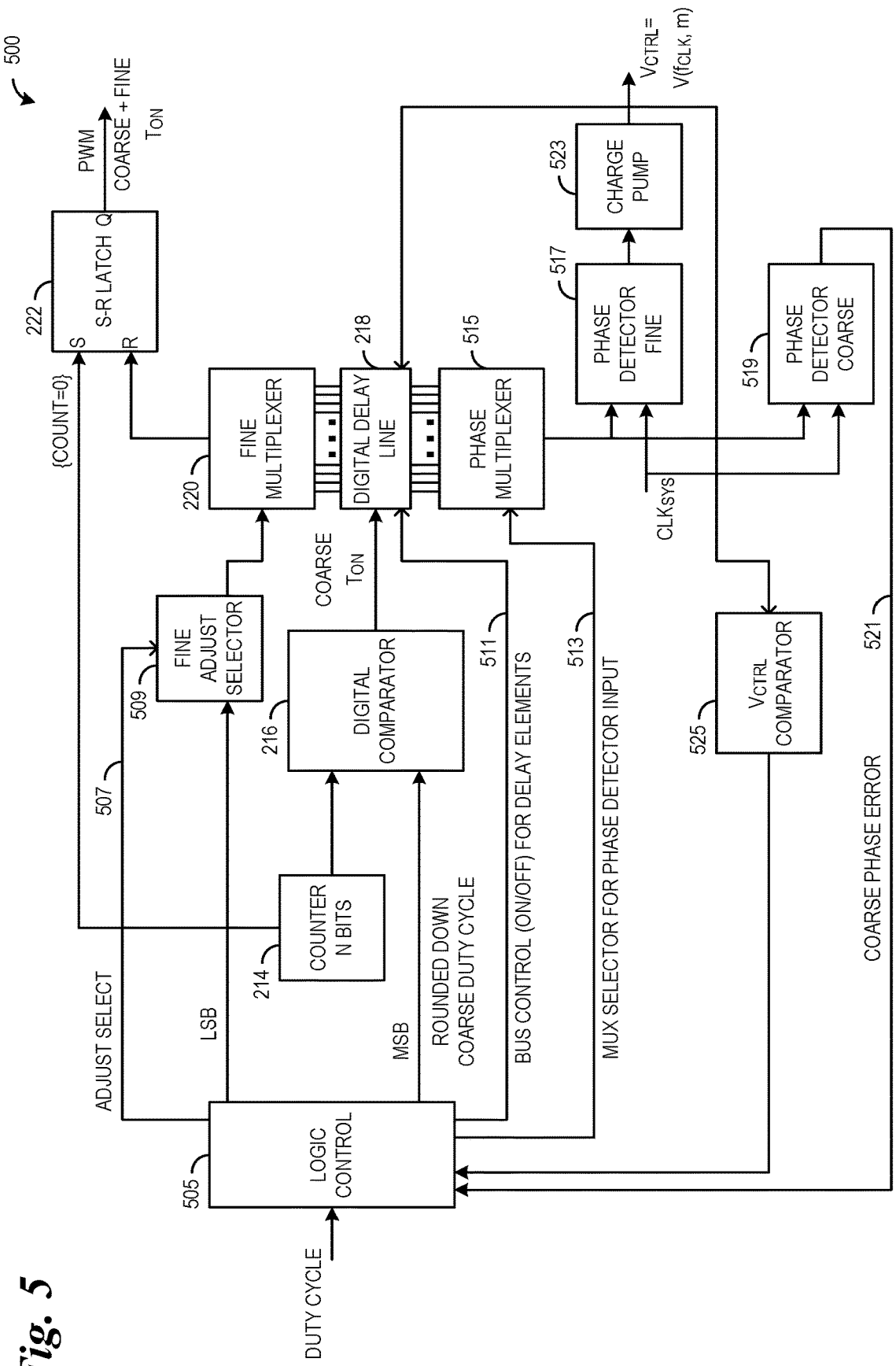
FIG. 5 illustrates a detailed view of a DPWM with logic and circuitry to adaptively control the delay of the DDL of a DC-DC converter according to an embodiment.

FIG. 5 illustrates a detailed view of a DPWM 500 with logic and circuitry to control the delay of the DDL of a DC-DC converter. DPWM 500 includes logic and circuitry to control the delay of the DDL of a DC-DC converter that controls the pulse widths of the pulses in the stream of variable pulse width pulses. As an example, DPWM 500 may be a replacement for DPWM 105 of prior art DC-DC converter 100 to provide control of the delay of the DDL of prior art DC-DC converter 100.

DPWM 500 includes counter 214, comparator 216, DDL 218, fine multiplexer 220, and register 222, which may be implemented in a similar manner or operate in a similar way to the circuits described in the description of DPWM 105 provided previously.

DPWM 500 includes a logic control circuit 505 is configured to assert logic values on an adjust select line 507 (coupled to fine adjust selector 509) in accordance with inputs, which include the duty cycle (e.g., $\delta = V_{OUT}/V_{IN}$) of the DC-DC converter. Fine adjust selector 509, which is also coupled to a LSB of a binary value generated by logic control circuit 505 that is used to generate the pulses of the stream of pulses. Fine adjust selector 509 selectively outputs the LSB of the binary value generated by logic control circuit 505 in accordance with the logic value asserted on adjust select line 507. The output of fine adjust selector 509 may be used as a select line for fine multiplexer 220, selectively selecting a delayed edge generated by DDL 218 or an undelayed edge as output by comparator 216. As an example, when a logic true value is asserted on adjust select line 507, fine adjust selector 509 does not output the LSB of the binary value, while if a logic false value is asserted on adjust select line 507, fine adjust selector 509 outputs the binary zero value. Alternate logic value mappings are possible.

As an example, logic control circuit 505 asserts a logic true value on adjust select line 507 to operate the DC-DC converter with the high precision afforded by the fine pulse width adjust circuit. As another example, logic control circuit 505 asserts a logic false value on adjust select line 507 to operate the DC-DC converter without the high precision afforded by the fine pulse width adjust circuit. As an example, the logic false value on adjust select line 507 results in the by-passing of the output of DDL 218, thereby eliminating the fine adjustments to $T_{ON}$ by the fine pulse width adjust circuit and resulting in $T_{ON}$ being solely dependent on the coarse pulse width adjust circuit (COARSE $T_{ON}$). Alternate mappings of the logic values may be possible.

Logic control circuit 505 changes the voltage $V_{CTRL}$, which is applied to the delay elements of DDL 218. Changing the voltage $V_{CTRL}$ may be a technique used to change the delay of DDL 218 of the DC-DC converter, for example. As an example, increasing the voltage $V_{CTRL}$ decreases the delay associated with each delay element of DDL 218 and decreases the overall delay of DDL 218 of the DC-DC converter. As another example, decreasing the voltage $V_{CTRL}$ increases the delay associated with each delay element of DDL 218 and increases the overall delay of DDL 218 of the DC-DC converter. There may be limitations to the maximum and minimum values of the voltage $V_{CTRL}$. The limitations may be due to the process technology of the DC-DC converter, the power supply of the DC-DC converter, and so on. Logic control circuit 505 may change the voltage $V_{CTRL}$ to change the delay of DDL 218 of the DC-DC converter as part of the techniques discussed below.

Logic control circuit 505 also asserts logic values on a bus control line 511 for the delay elements of DDL 218. Bus control line 511 is coupled to DDL 218 and may be used to activate or deactivate delay elements of DDL 218 in accordance with multiplexer selector line 513. The delay elements of DDL 218 may be deactivated by eliminating power to the delay elements or removing the clock from the delay elements. Conversely, the delay elements of DDL 218 may be activated by providing power to the delay elements or allowing the clock to propagate to the delay elements. In an embodiment, only disabled delay elements of DDL 218 are deactivated.

As an example, a logic true value asserted on bus control line 511 results in the deactivation of the disabled delay elements of DDL 218, while a logic false value asserted on bus control line 511 results in the activation of the disabled delay elements of DDL 218. Alternate mappings of the logic values may be possible.

Logic control circuit 505 also asserts logic values on a multiplexer selector line 513. Multiplexer selector line 513, coupled to phase multiplexer 515, may be used to select an input of phase multiplexer 515, which are coupled to outputs of the delay elements of DDL 218, to output. Because there may be more than two inputs to phase multiplexer 515, multiplexer selector line 513 may be a multi-bit selector line. In an embodiment, the output of each delay element of DDL 218 can be selected for output. In an embodiment, the output of a subset of the delay elements of DDL 218 can be selected for output. As an example, the outputs of every second, fourth, eighth, sixteenth, and so on, delay element of DDL 218 can be selected for output. Other delay elements may be selected for outputs.

A $V_{CTRL}$ comparator 525 compares $V_{CTRL}$ with the maximum and minimum limitations of $V_{CTRL}$ and provides control information to logic control circuit 505. Logic control circuit 505 uses the control information to set the value on multiplexer selector line 513, for example. As an example, if $V_{CTRL}$ is less than (or less than or equal to) the minimum value of $V_{CTRL}$, logic control circuit 505 asserts a value on multiplexer selector line 513 to increase the number of enabled delay elements in DDL 218. As an another example, if is greater than (or greater than or equal to) the maximum value of $V_{CTRL}$, logic control circuit 505 asserts a value on multiplexer selector line 513 to decrease the number of enabled delay elements in DDL 218.

In an embodiment, logic control circuit 505 attempts to adjust the delay of DDL 218 of the DC-DC converter by changing $V_{CTRL}$ to change the delay of the individual delay elements of DDL 218. However, if a maximum or minimum limit to $V_{CTRL}$ is met and the output of the DC-DC converter has not met desired output, logic control circuit 505 resorts to changing the number of enabled delay elements in DDL 218 by performing the second phase. In an embodiment, logic control circuit 505 may perform multiple iterations of adjusting the delay of DDL 218 by changing $V_{CTRL}$ and changing the number of enabled delay elements of DDL 218 until the output of the DC-DC converter meets the desired output precision $\Delta V_{OUT}$.

The output of phase multiplexer 515 (the delayed edge generated by DDL 218) is coupled to a fine phase detector 517 and a coarse phase detector 519. In an embodiment, both fine phase detector 517 and coarse phase detector 519 compares the output of phase multiplexer 515 with the system clock of the DC-DC converter and generates a phase error from the comparison, where fine phase detector 517 performs a fine grain comparison of the system clock of the DC-DC converter with the output of phase multiplexer 515 and coarse phase detector 519 performs a coarse grain comparison of the system clock of the DC-DC converter with the output of phase multiplexer 515. As an example, fine phase detector 517 is a more accurate phase detector than coarse phase detector 519.

The output of coarse phase detector 519, referred to as a coarse phase error 521, is provided to logic control circuit 505. Logic control circuit 505 compares coarse phase error 521 with the phase error threshold and adjusts the delay of DDL 218 until coarse phase error 521 meets the phase error threshold. As an example, logic control circuit 505 changes the value of the voltage $V_{CTRL}$, changes the value of multiplexer selector line 513 to select the output of a greater number or a smaller number of delay elements of DDL 218 to change the delay, or both. Selecting the output of a particular delay element effectively disables the delay elements that are subsequent to the delay element associated with the selected output. Logic control circuit 505 continues to adjust the delay until coarse phase error 521 is less than or equal to the phase error threshold, for example. When the phase error threshold is met, logic control circuit 505 may assert a logic true value on bus control line 511 to deactivate the disabled delay elements. The order of the adjustments of the delay of DDL 218 may differ in different embodiments.

The output of fine phase detector 517 (the phase error) is provided to a charge pump 523, which converts the phase error into the output voltage $V_{CTRL}$ of the DC-DC converter, which may be used to change the delay of the individual delay elements of DDL 218.

Figure 6:
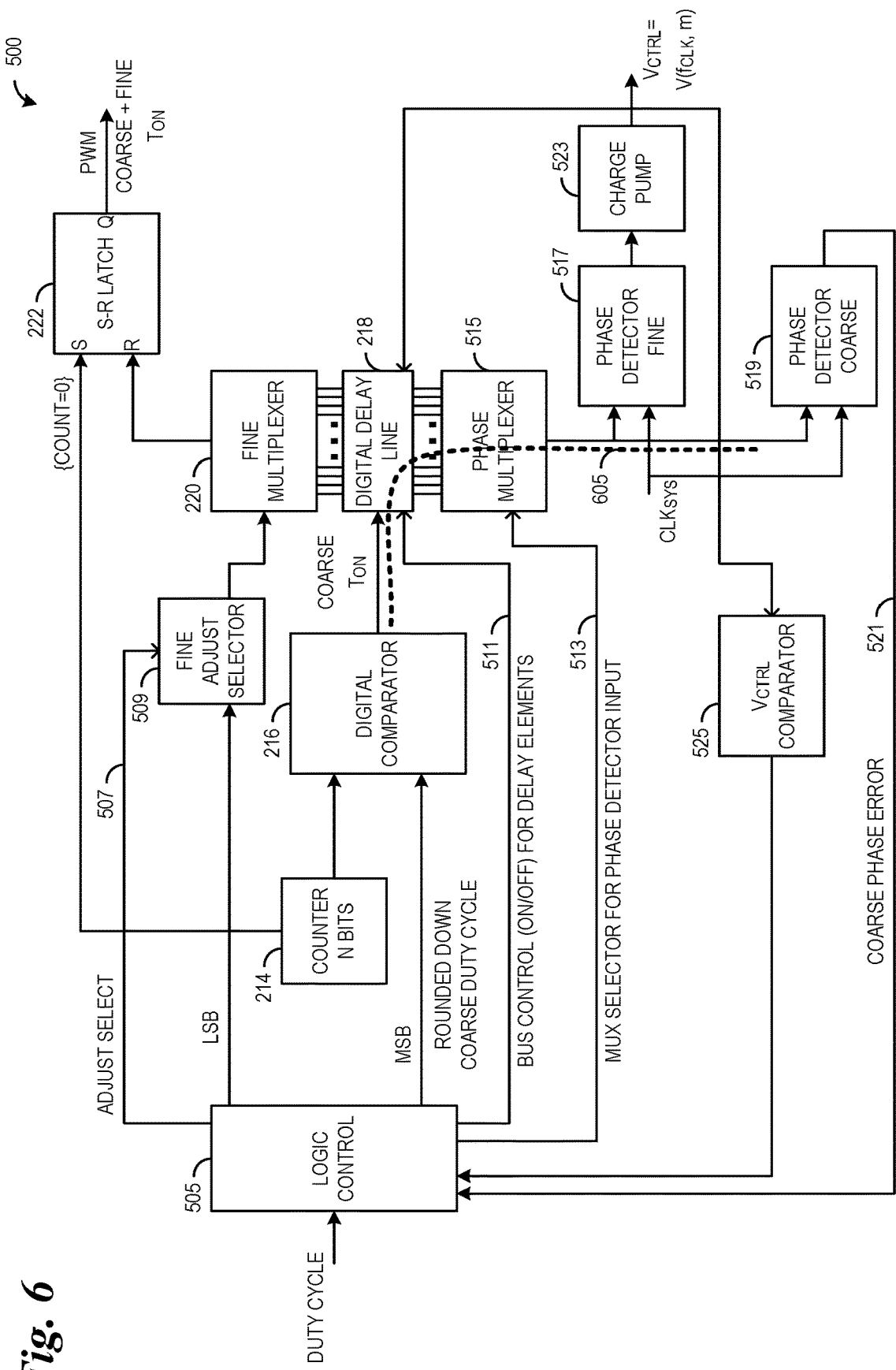
FIG. 6 illustrates a detailed view of a DPWM of FIG. 5 with logic and circuitry to control the delay of the DDL of a DC-DC converter, highlighting the control of the delay of the DDL of the DC-DC converter to meet the desired output precision of the DC-DC converter according to an embodiment.

FIG. 6 illustrates a detailed view of DPWM 500 with logic and circuitry to control the delay of the DDL of a DC-DC converter, highlighting the control of the delay of the DDL of the DC-DC converter to meet the desired output precision of the DC-DC converter.

As discussed previously, the control of the delay of the DDL of the DC-DC converter may be considered to be a multi-phase process, with the first phase comprising fine adjustments to the delay of the DDL of the DC-DC converter and the second phase comprising coarse adjustments to the delay of the DDL of the DC-DC converter. The order of the adjustments to the delay of the DDL may differ in different embodiments.

In the first phase, the delay of the delay elements of the DDL of the DC-DC converter may be set by changing the control voltage $V_{CTRL}$. As an example, the phase error (e.g., output of coarse phase detector 519) between the system clock of the DC-DC converter and the output of the selected delay elements of the DDL is compared with the phase error threshold, and the control voltage $V_{CTRL}$ is adjusted until the phase error meets the phase error threshold or the control voltage $V_{CTRL}$ has met a maximum or minimum limit. The limitations to the maximum and minimum values of the voltage $V_{CTRL}$ may be due to the process technology of the DC-DC converter, the power supply of the DC-DC converter, and so on.

If the control voltage $V_{CTRL}$ has met the maximum or minimum limit before the phase error has met the phase error threshold, the second phase is performed. In the second phase, the number of enabled delay units of the DDL is adjusted. As an example, the delay of the DDL is increased by enabling one or more additional delay units and the phase error between the system clock of the DC-DC converter and the output of the DDL is compared with the phase error threshold. As another example, the delay of the DDL is decreased by disabling one or more additional delay units and the phase error between the system clock of the DC-DC converter and the output of the DDL is compared with the phase error threshold. The enabling or disabling of individual delay elements may continue until the phase error is met or is relatively close to being met. If the phase error is relatively close to being met, the first phase is performed to fine tune the delay until the phase error threshold is met.

Details of the second phase include logic control circuit 505 selecting an input of phase multiplexer 515 (which may be the output of comparator 216 delayed by DDL 218) to output to fine phase detector 517 and coarse phase detector 519. Dashed line 605 highlights the path of the output of comparator 216. Coarse phase detector 519 generates coarse phase error 521 between the output of phase multiplexer 515 and the system clock of the DC-DC converter. Logic control circuit 505 compares coarse phase error 521 with the phase error threshold and determines if coarse phase error 521 is within the phase error threshold. If coarse phase error 521 is not within the phase error threshold, logic control circuit 505 adjusts the delay introduced to the output of comparator 216 by DDL 218.

As an example, logic control circuit 505 changes the voltage $V_{CTRL}$ provided to the delay elements of DDL 218. As an example, increasing the voltage provided to the delay elements of DDL 218 increases the current, resulting in a decrease in the delay associated with each of the delay elements of DDL 218. As another example, decreasing the voltage provided to the delay elements of DDL 218 decreases the current, resulting in an increase in the delay associated with each of the delay elements of DDL 218.

As an example, logic control circuit 505 changes the number of enabled delay elements of DDL 218. As an example, logic control circuit 505 increases the number of enabled delay elements of DDL 218 to increase the delay to the output of comparator 216 by changing the value asserted on multiplexer selector line 513. As another example, logic control circuit 505 decreases the number of enabled delay elements to decrease the delay to the output of comparator 216 by changing the value asserted on multiplexer selector line 513. In an embodiment, the adjustment of the delay continues until coarse phase error 521 meets the phase error threshold.

In an embodiment, logic control circuit 505 changes the delay of DDL 218 of the DC-DC converter by first changing the voltage $V_{CTRL}$, and if the desired output is not achieved, logic control circuit 505 changes the number of enabled delay elements of DDL 218 to change the delay of DDL 218 of the DC-DC converter. Logic control circuit 505 may be required to perform multiple iterations of changing the voltage $V_{CTRL}$ and changing the number of enabled delay elements before meeting the desired output precision.

In an embodiment, a timer may be utilized to time out the adjustment of the delay to prevent the situation where it may not be possible to sufficiently adjust the delay so that coarse phase error 521 meets the phase error threshold. In such a situation, logic control circuit 505 may have indicate the occurrence of an error, repeat the adjustment of the delay using a different adjustment technique or approach, repeat the adjustment of the delay with a different starting point (e.g., starting with all delay elements disabled instead of starting with all delay elements enabled), and so on.

Figure 7:
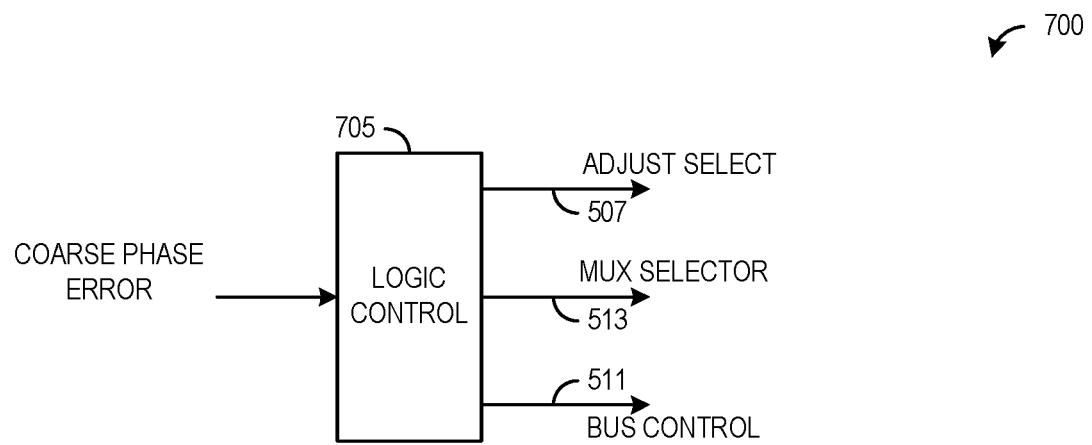
FIG. 7 illustrates a circuit generating an adjust select line, a bus control line, and a multiplexer selector line according to an embodiment.

FIG. 7 illustrates a circuit 700 generating adjust select line 507, bus control line 511, and multiplexer selector line 513. Circuit 700 may be a part of DPWM 500 of FIG. 5, for example. Circuit 700 includes a control circuit 705 configured to assert logic values on adjust select line 507 to enable of disable fine multiplexer 220. Control circuit 705 is also configured to assert logic values on bus control line 511 to activate of deactivate delay elements of DDL 218. As an example, a logic true value asserted on bus control line 511 results in the deactivation of the disabled delay elements of DDL 218, while a logic false value asserted on bus control line 511 results in the activation of the disabled delay elements of DDL 218. Alternate mappings of the logic values may be possible.

Control circuit 705 is also configured to assert values on multiplexer selector line 513 to select an input of phase multiplexer 515, which are coupled to outputs of the delay elements of DDL 218, to output. Because there may be more than two inputs to phase multiplexer 515, multiplexer selector line 513 may be a multi-bit selector line. In an embodiment, the output of each delay element of DDL 218 can be selected for output. In an embodiment, the output of a subset of the delay elements of DDL 218 can be selected for output. As an example, the outputs of every second, fourth, eighth, sixteenth, and so on, delay element of DDL 218 can be selected for output. Other delay elements may be selected for outputs.

Figure 8:
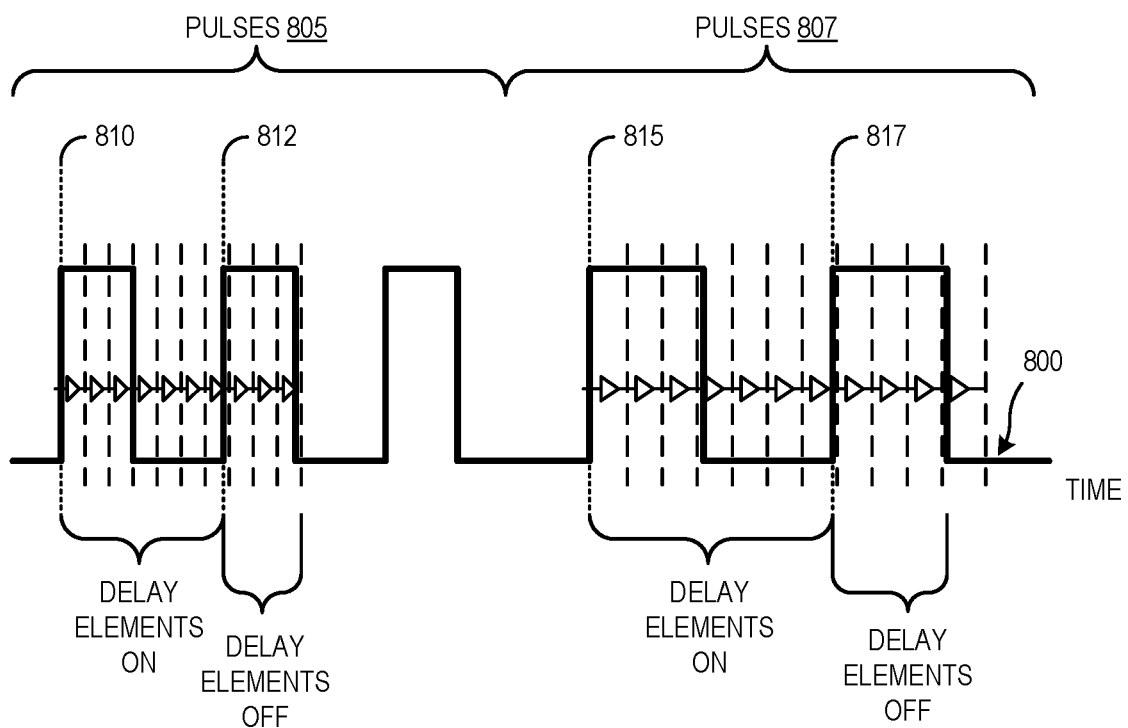
FIG. 8 illustrates a signal highlighting the control of the the signal by adjusting the number of enabled delay elements according to an embodiment.

FIG. 8 illustrates a signal 800 highlighting the control of signal 800 by adjusting the number of enabled delay elements. As shown in FIG. 8, signal 800 comprises pulses with different frequencies, where pulses 805 are at a first frequency and pulses 807 are at a second frequency. A pulse 805 starts at about time 810 and ends at about time 812. The duration of pulse 805 corresponds to the delay of the enabled delay elements of the DDL. Similarly, a pulse 807 starts at about time 815 and ends at about time 817. The duration of pulse 807 corresponds to the delay of the enabled delay elements of the DDL. Although the duration of the two pulses are different, the DDL has the same number of enabled delay elements, meaning that the delay of the individual delay elements of the DDL associated with pulse 807 is greater than the delay of the individual delay elements of the DDL associated with pulse 805. Although FIG. 8 illustrates the situation where the DDL maintains the same number of delay elements for generating pulses with different frequencies, the number of delay elements may also change for different pulses with different frequencies.

Figure 9:
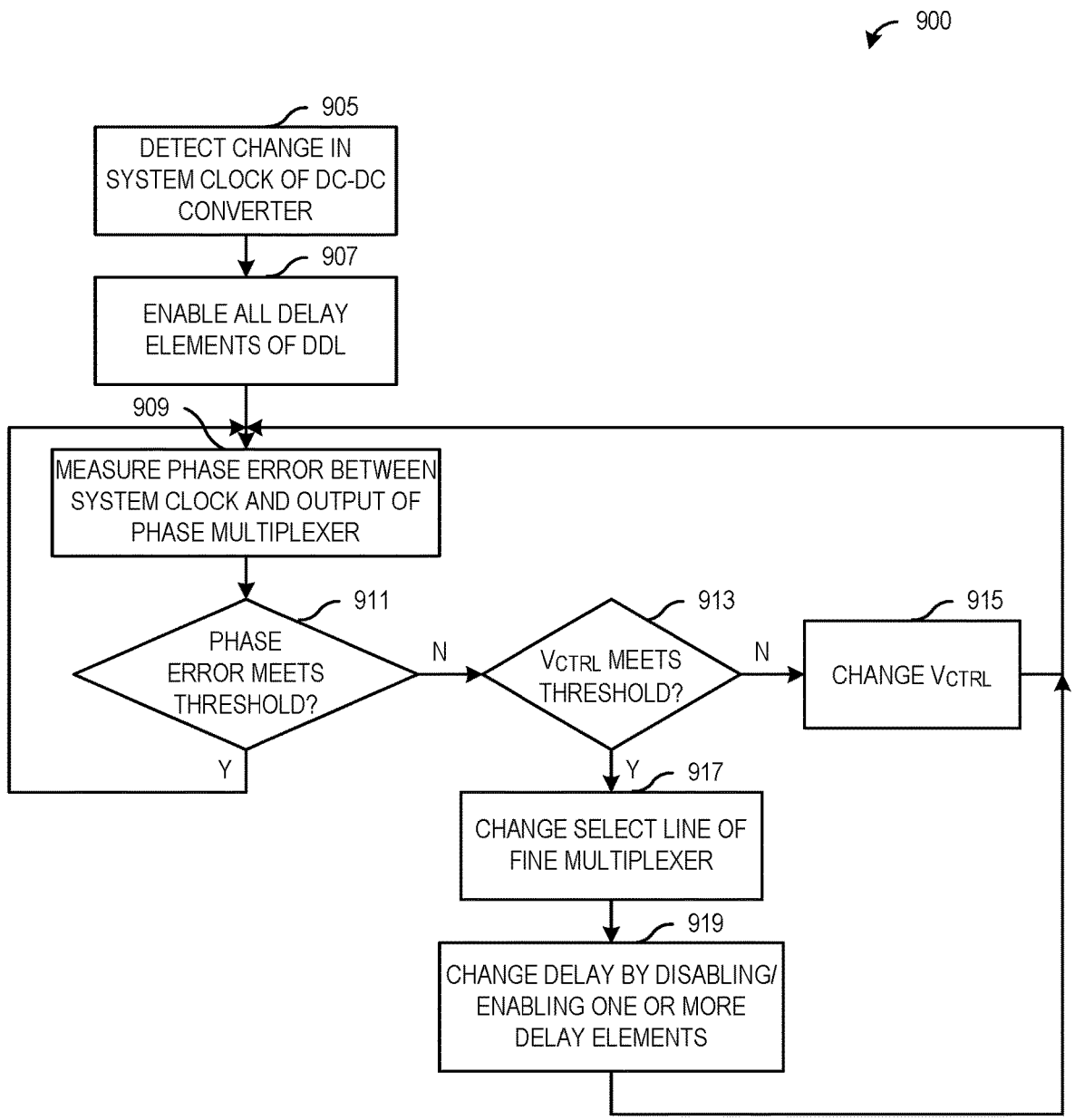
FIG. 9 illustrates a flow diagram of example operations occurring in the control of the output precision of the DC-DC converter by changing the delay associated with the DDL according to an embodiment.

FIG. 9 illustrates a flow diagram of example operations 900 occurring in the control of the output precision of the DC-DC converter by changing the delay associated with the DDL. Operations 900 may be indicative of operations occurring in logic control circuit 505 as logic control circuit 505 controls the output precision of the DC-DC converter by changing the delay associated with the DDL utilizing the multiple phase technique presented herein.

Operations 900 begin with the detection of a change in the system clock frequency of the DC-DC converter (block 905). The change in the system clock frequency of the DC-DC converter may be detected when a mode of the DC-DC converter changes, for example. As another example, the change in the system clock frequency of the DC-DC converter is detected when an instruction to change the system clock frequency is executed.

All delay elements of the DDL of the DC-DC converter are enabled (block 907). By enabling all of the delay elements, the delay of the DDL is maximized for the given clock frequency. As an illustrative example, the enabling of all of the delay elements may be achieved by configuring the phase multiplexer to select the output of the last delay element (or the last selectable delay element in the situation where not every delay element is individually selectable) of the DDL, thereby selecting the maximum delay imparted onto the pulse generated by the coarse pulse width adjust circuit. Alternatively, none of the delay elements of the DDL of the DC-DC converter are enabled. By disabling all of the delay elements, the delay of the DDL is minimized for the given clock frequency. As an illustrative example, the disabling of all of the delay elements may be achieved by configuring the phase multiplexer to select the input of the first delay element (or the first selectable delay element in the situation where not every delay element is individually selectable) of the DDL, thereby selecting the minimum delay imparted onto the pulse generated by the coarse pulse width adjust circuit. Alternatively, a fraction (e.g., ½, ⅓, ¼, ⅕, ⅙, etc.) of the delay elements of the DDL are enabled, with the remainder disabled. Other fractions are possible. The phase error between the system clock and the output of the selected delay element of the DDL of the DC-DC converter is measured (block 909). As an example, the coarse phase detector is used to generate the phase error.

A check is performed to determine if the phase error meets the phase error threshold (block 911). The phase error, as generated by the coarse phase error detector is compared with the phase error threshold. If the phase error is less than (or less than and equal to) the phase error threshold, the phase error may be said to have met the phase error threshold, for example. If the phase error is not less than the phase error threshold, the phase error is said to have not met the phase error threshold, for example.

If the phase error does not meet the phase error threshold, another check is performed to determine if the voltage $V_{CTRL}$ has met a voltage threshold (block 913). The voltage threshold may be a maximum voltage threshold, a minimum voltage threshold, or both a maximum and minimum voltage threshold. If the voltage $V_{CTRL}$ has not met the voltage threshold, the voltage $V_{CTRL}$ is changed (block 915) and logic control circuit 505 returns to block 909 to measure the phase error. The voltage $V_{CTRL}$ may be increased or decreased in accordance with the value of the phase error (e.g., if the phase error is negative or positive), for example. As an example, if the phase error is negative, the control voltage $V_{CTRL}$ is increased, while if the phase error is positive, the control voltage $V_{CTRL}$ is decreased. Alternative mappings are possible. In an embodiment, the amount of change in the voltage $V_{CTRL}$ is based on the magnitude of the phase error. As an example, if the magnitude of the phase error is large, the amount of change in the voltage $V_{CTRL}$ is also large. Conversely, if the magnitude of the phase error is small, the amount of change in the voltage $V_{CTRL}$ is also small.

If the voltage $V_{CTRL}$ meets the voltage threshold, the voltage $V_{CTRL}$ has met its minimum or maximum threshold and can no longer be changed, hence it may be necessary to change the number of enabled delay elements of the DDL. In such a situation, the select lines for the multiplexers are changed (block 917). For example, multiplexer selector line 513 to phase multiplexer 515 may be changed to reflect the decreased or increased number of enabled delay elements. As an illustrative example, the disabling or enabling of one or more delay elements of the DDL may be achieved by configuring multiplexer selector line 513 of phase multiplexer 515 to select the output of a shorter or longer sequence of delay elements, as well as the LSB output of logic control circuit 505 to fine adjust selector 509 and fine multiplexer 220, thereby selecting a smaller or larger delay on the pulse generated by the coarse pulse width adjust circuit. The delay is changed by disabling or enabling one or more delay elements of the DDL (block 919). Decreasing the delay results in a shortening of the pulse width. Increasing the delay results in the lengthening of the pulse width. As discussed previously, the decreasing or increasing of the number of enabled delay elements may be on a single delay element basis (where individual delay elements may be disabled or enabled at a time) or a group basis (where a group of two or more delay elements may be disabled or enabled at a time). In an embodiment, the disabled delay elements may also be deactivated during block 919. The measuring of the phase error (block 909) and the determining if the phase error meets the phase error threshold (block 911) are repeated.

Although operations 900 shown in FIG. 9 illustrates an example implementation where the first phase of delay adjustment is performed prior to performing the second phase of delay adjustment, alternative implementations where the second phase of delay adjustment is performed prior to performing the first phase of delay adjustment. Furthermore, alternative implementations where the number of enabled delay elements of the DDL for different system clock frequencies may be stored in a memory and retrieved for use as a starting point of the delay adjustment process are also possible. It is also possible to combine features of multiple implementations.

A timer may be implemented to prevent an extended amount of time spent on adjusting the system clock of the DC-DC converter. Operations 900 illustrate a situation where the adjusting of the delay in a potentially increasing or decreasing manner (i.e., the delay may be decreased or increased until the phase error meets the phase error threshold, alternate embodiments may include situations where the change in the delay occurs monotonically (i.e., the delay is continually decreased or increased until the phase error meets the phase error threshold) until the phase error meets the phase error threshold.

In an embodiment, the disabled delay elements may be deactivated. The deactivation of the disabled delay elements of the DDL helps to reduce power consumption by removing power from the disabled delay elements. The disabled delay elements may be deactivated through the assertion of a logic true value on the bus control line, for example. The disabled delay elements may be deactivated upon disabling. Alternatively, the disabled delay elements are not deactivated until the adjusting of the delay of the DDL is complete.

For illustrative purposes, consider an example DC-DC converter operating at 50 MHz with a DDL with 128 delay elements. Using a commonly available 180 nm process technology, each delay element may consume about 6.03 uA each. Therefore, the entire DDL will consume 6.03 uA*128~772 uA. Hence, if the full delay of the DDL of the DC-DC converter is not required, operating without the DDL would save up to 772 uA.

Example embodiments of the invention are summarized here. Other embodiments can also be understood from the entirety of the specification as well as the claims filed herein. Reference numerals are added below for illustration purposes only and the various examples could be implemented differently and are not to be construed as being limited to only these illustrations.

Example 1. A direct current (DC) to DC (DC-DC) converter including: a comparator (216) configured to set a pulse width of a signal pulse (230, 258, 305, 450, 800, 805, 807), the pulse width corresponding to a voltage level of an output voltage of the DC-DC converter; a digital delay line (DDL) (218) operatively coupled to the comparator, the DDL configured to adjust the pulse width of the signal pulse by linearly introducing delays to the signal pulse; a multiplexer (515) operatively coupled to the DDL, the multiplexer configured to selectively output a delayed version of the signal pulse; a phase detector (519) operatively coupled to a system clock line and the multiplexer, the phase detector configured to generate a phase error between an output of the multiplexer and a system clock on the system clock line; and a logic control circuit (505, 700) operatively coupled to the multiplexer and the DDL, the logic control circuit configured to adjust a delay introduced to the signal pulse in accordance with the phase error.

Example 2. The DC-DC converter of example 1, where the DDL includes a linear sequence of delay elements, and where the logic control circuit is configured to deactivate delay elements of the linear sequence of delay elements not configured to introduce the delay to the signal pulse.

Example 3. The DC-DC converter of one of examples 1 or 2, where the logic control circuit is configured to remove a clock signal to the deactivated delay elements.

Example 4. The DC-DC converter of one of examples 1 to 3, where the logic control circuit is configured to generate a bus control signal, and based on the bus control signal, the logic control circuit is configured to deactivate the delay elements of the linear sequence of delay elements not configured to introduce the delay to the signal pulse.

Example 5. The DC-DC converter of one of examples 1 to 4, where the bus control signal is asserted on a bus control line coupled between the logic control circuit and the DDL.

Example 6. The DC-DC converter of one of examples 1 to 5, where the logic control circuit is configured to generate a multiplexer selector signal, and based on the multiplexer selector signal, the logic control circuit is configured to select an output of a delay element of a linear sequence of delay elements to output a delayed signal pulse.

Example 7. The DC-DC converter of one of examples 1 to 6, where the multiplexer selector signal is asserted on a multiplexer select line coupled between the logic control circuit and the multiplexer.

Example 8. The DC-DC converter of one of examples 1 to 7, where the logic control circuit is configured to adjust the delay introduced to the signal pulse until the phase error meets a phase error threshold.

Example 9. The DC-DC converter of one of examples 1 to 8, where the logic control circuit is configured to decrease the delay introduced to the signal pulse by disabling one or more delay elements until the phase error meets the phase error threshold.

Example 10. The DC-DC converter of one of examples 1 to 9, where the logic control circuit is configured to increase the delay introduced to the signal pulse by enabling one or more delay elements until the phase error meets the phase error threshold.

Example 11. The DC-DC converter of one of examples 1 to 10, where the DDL includes a linear sequence of enabled delay elements, and where the logic control circuit is configured to adjust the delay by changing a delay associated with each enabled delay element of the DDL.

Example 12. A method for operating a direct current (DC) to DC (DC-DC) converter, the method including: determining, by the DC-DC converter, a system clock for the DC-DC converter in accordance with an operating frequency for the DC-DC converter; measuring, by the DC-DC converter, a phase error between a system clock of the DC-DC converter and an output of a delay element of a digital delay line configured to change a pulse width of a signal pulse by linearly introducing delays to the signal pulse; adjusting, by the DC-DC converter, a delay of the digital delay line of the DC-DC converter by altering a number of enabled delay elements of the digital delay line; and repeating, by the DC-DC converter, the measuring and the adjusting until the phase error meets a phase error threshold.

Example 13. The method of example 12, where the digital delay line is initially configured to introduce a maximum delay, and where the adjusting includes decreasing the delay by decreasing the number of enabled delay elements of the digital delay line.

Example 14. The method of one of examples 12 or 13, where the digital delay line is initially configured to introduce a minimum delay, and where the adjusting includes increasing the delay by increasing the number of enabled delay elements of the digital delay line.

Example 15. The method of one of examples 12 to 14, where the adjusting further includes adjusting a delay associated with each enabled delay element of the digital delay line.

Example 16. The method of one of examples 12 to 15, further including deactivating, by the DC-DC converter, disabled delay elements of the digital delay line.

Example 17. A direct current (DC) to DC (DC-DC) converter including: a comparator configured to set a pulse width of a signal pulse, the pulse width corresponding to a voltage level of an output voltage of the DC-DC converter; a digital delay line (DDL) operatively coupled to the comparator, the DDL configured to change the pulse width of the signal pulse by linearly introducing delays to the signal pulse; a multiplexer operatively coupled to the DDL, the multiplexer configured to selectively output a delayed version of the signal pulse; a phase detector operatively coupled to a system clock line and the multiplexer, the phase detector configured to generate a phase error between an output of the multiplexer and a system clock on the system clock line; one or more processors; and a non-transitory memory storage including instructions that, when executed by the one or more processors, cause the DC-DC converter to: measure a phase error between the system clock of the DC-DC converter and an output of the multiplexer; adjust a delay of the digital delay line of the DC-DC converter by altering a number of enabled delay elements of the digital delay line; and repeat the phase error measuring and the pulse width adjusting until the phase error meets a phase error threshold.

Example 18. The DC-DC converter of example 17, where the digital delay line is initially configured to introduce a maximum delay, and where the instructions cause the DC-DC converter to decrease the delay.

Example 19. The DC-DC converter of one of examples 17 or 18, where the digital delay line is initially configured to introduce a minimum delay, and where the instructions cause the DC-DC converter to increase the delay.

Example 20. The DC-DC converter of one of examples 17 to 19, the instructions further causing the DC-DC converter to adjust the delay of the digital delay line by altering a delay associated with each enabled delay elements of the digital delay line.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A direct current (DC) to DC (DC-DC) converter comprising:
   a comparator configured to set a pulse width of a signal pulse, the pulse width corresponding to a voltage level of an output voltage of the DC-DC converter;
   a digital delay line (DDL) operatively coupled to the comparator, the DDL configured to adjust the pulse width of the signal pulse by linearly introducing delays to the signal pulse, wherein the DDL comprises a linear sequence of delay elements;
   a multiplexer operatively coupled to the DDL, the multiplexer configured to selectively output a delayed version of the signal pulse;
   a phase detector operatively coupled to receive a system clock on a system clock line and the multiplexer, the phase detector configured to generate a phase error based on a received output of the multiplexer and the received system clock on the system clock line; and
   a logic control circuit operatively coupled to the multiplexer and the DDL, the logic control circuit configured to adjust a delay introduced to the signal pulse in accordance with the phase error, wherein the logic control circuit is configured to deactivate delay elements of the linear sequence of delay elements not configured to introduce the delay to the signal pulse.

2. The DC-DC converter of claim 1, wherein the logic control circuit is configured to remove a clock signal to the deactivated delay elements.

3. The DC-DC converter of claim 1, wherein the logic control circuit is configured to generate a bus control signal, and based on the bus control signal, the logic control circuit is configured to deactivate the delay elements of the linear sequence of delay elements not configured to introduce the delay to the signal pulse.

4. The DC-DC converter of claim 3, wherein the bus control signal is asserted on a bus control line coupled between the logic control circuit and the DDL.

5. The DC-DC converter of claim 1, wherein the logic control circuit is configured to generate a multiplexer selector signal, and based on the multiplexer selector signal, the logic control circuit is configured to select an output of a delay element of the linear sequence of delay elements to output a delayed signal pulse.

6. The DC-DC converter of claim 5, wherein the multiplexer selector signal is asserted on a multiplexer select line coupled between the logic control circuit and the multiplexer.

7. The DC-DC converter of claim 1, wherein the logic control circuit is configured to adjust the delay introduced to the signal pulse until the phase error meets a phase error threshold.

8. The DC-DC converter of claim 7, wherein the logic control circuit is configured to decrease the delay introduced to the signal pulse by disabling one or more delay elements until the phase error meets the phase error threshold.

9. The DC-DC converter of claim 7, wherein the logic control circuit is configured to increase the delay introduced to the signal pulse by enabling one or more delay elements until the phase error meets the phase error threshold.

10. The DC-DC converter of claim 7, wherein the DDL comprises a linear sequence of enabled delay elements, and wherein the logic control circuit is configured to adjust the delay by changing a delay associated with each enabled delay element of the DDL.

11. A method for operating a direct current (DC) to DC (DC-DC) converter, the method comprising:
    determining, by the DC-DC converter, a system clock for the DC-DC converter in accordance with an operating frequency for the DC-DC converter;
    measuring, by the DC-DC converter, a phase error based on a system clock of the DC-DC converter and an output of a delay element of a digital delay line configured to change a pulse width of a signal pulse by linearly introducing delays to the signal pulse;
    adjusting, by the DC-DC converter, a delay of the digital delay line of the DC-DC converter by altering a number of enabled delay elements of the digital delay line;
    repeating, by the DC-DC converter, the measuring and the adjusting until the phase error meets a phase error threshold; and
    deactivating, by the DC-DC converter, delay elements of the digital delay line that are not enabled.

12. The method of claim 11, wherein the digital delay line is initially configured to introduce a maximum delay, and wherein the adjusting comprises decreasing the delay by decreasing the number of enabled delay elements of the digital delay line.

13. The method of claim 11, wherein the digital delay line is initially configured to introduce a minimum delay, and wherein the adjusting comprises increasing the delay by increasing the number of enabled delay elements of the digital delay line.

14. The method of claim 11, wherein the adjusting further comprises adjusting a delay associated with each enabled delay element of the digital delay line.

15. A direct current (DC) to DC (DC-DC) converter comprising:
    a comparator configured to set a pulse width of a signal pulse, the pulse width corresponding to a voltage level of an output voltage of the DC-DC converter;

a digital delay line (DDL) operatively coupled to the comparator, the DDL configured to change the pulse width of the signal pulse by linearly introducing delays to the signal pulse;

a multiplexer operatively coupled to the DDL, the multiplexer configured to selectively output a delayed version of the signal pulse;

a phase detector operatively coupled to receive a system clock on a system clock line and the multiplexer, the phase detector configured to generate a phase error based on an output of the multiplexer and the received system clock on the system clock line;

one or more processors; and a non-transitory memory storage comprising instructions that, when executed by the one or more processors, cause the DC-DC converter to:

adjust a delay of the digital delay line of the DC-DC converter by altering a number of enabled delay elements of the digital delay line based on the generated phase error, repeat the pulse width adjusting until the phase error meets a phase error threshold, and deactivate delay elements of the digital delay line that are not enabled.

16. The DC-DC converter of claim 15, wherein the digital delay line is initially configured to introduce a maximum delay, and wherein the instructions cause the DC-DC converter to decrease the delay.

17. The DC-DC converter of claim 15, wherein the digital delay line is initially configured to introduce a minimum delay, and wherein the instructions cause the DC-DC converter to increase the delay.

18. The DC-DC converter of claim 15, the instructions further causing the DC-DC converter to adjust the delay of the digital delay line by altering a delay associated with each enabled delay elements of the digital delay line.

19. The DC-DC converter of claim 15, the instructions further causing the DC-DC converter to:

generate a bus control signal; and based on the bus control signal, deactivate the delay elements of the digital delay line that are not enabled.

20. The method of claim 11, further comprising:

generating a bus control signal; and based on the bus control signal, deactivating the delay elements of the digital delay line that are not enabled.

* * * * *